(12) United States Patent
De Bernardinis et al.

(10) Patent No.: US 8,902,009 B1
(45) Date of Patent: *Dec. 2, 2014

(54) TUNING CIRCUIT FOR INDUCTOR CAPACITOR (LC) TANK DIGITALLY CONTROLLED OSCILLATOR

(71) Applicant: Marvell International Ltd., Hamilton (BM)

(72) Inventors: Fernando De Bernardinis, Pavia (IT); Luca Fanori, Pavia (IT); Antonio Liscidini, Pavia (IT)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/661,801

(22) Filed: Oct. 26, 2012

Related U.S. Application Data

(63) Continuation of application No. 12/956,641, filed on Nov. 30, 2010, now Pat. No. 8,299,862.

(60) Provisional application No. 61/266,063, filed on Dec. 2, 2009.

(51) Int. Cl.
H03B 5/12 (2006.01)

(52) U.S. Cl.
USPC .............. 331/117 FE; 331/179; 331/177 V; 331/36 C

(58) Field of Classification Search
CPC .. H03B 5/1215; H03B 5/1225; H03B 5/1253; H03B 5/1246; H03B 5/1265; H03B 5/1212; H03B 5/1228; H03B 5/1206; H03B 5/12; H03B 5/08; H03B 1/00; H03B 2200/004; H03B 2200/005; H03B 2201/0228
USPC ......... 331/117 R, 117 FE, 167, 177 V, 177 R, 331/36 C, 34
See application file for complete search history.

(56) References Cited

U.S. PATENT DOCUMENTS

| | | | |
|---|---|---|---|
| 6,583,675 B2 | 6/2003 | Gomez | |
| 7,589,596 B2 * | 9/2009 | Masuda et al. | 331/36 C |
| 8,299,862 B1 * | 10/2012 | De Bernardinis et al. | 331/117 FE |
| 2006/0208818 A1 | 9/2006 | Lee et al. | |
| 2006/0261902 A1 * | 11/2006 | Masuda et al. | 331/36 C |
| 2007/0132522 A1 | 6/2007 | Lee et al. | |
| 2008/0204157 A1 | 8/2008 | Tsukizawa et al. | |

* cited by examiner

Primary Examiner — Ryan Johnson

(57) ABSTRACT

In one embodiment, an apparatus includes a first circuit of a digitally controlled oscillator (DCO). The first circuit has a loss component. A second circuit is coupled to the first circuit and configured to transform a positive impedance into a negative impedance in series with a negative resistance. The negative impedance includes an adjustable reactive component used to adjust a frequency of an output signal of the DCO. An equivalent reactance seen by the first circuit is less than a reactance of the adjustable reactive component.

12 Claims, 8 Drawing Sheets

TUNING CIRCUIT FOR INDUCTOR CAPACITOR (LC) TANK DIGITALLY CONTROLLED OSCILLATOR

CROSS-REFERENCE TO RELATED APPLICATIONS

This application is a continuation of U.S. patent application Ser. No. 12/956,641 (now U.S. Pat. No. 8,299,862), filed on Nov. 30, 2010, which claims the benefit of U.S. Provisional Application No. 61/266,063, filed on Dec. 2, 2009. The entire disclosures of the above applications are incorporated herein by reference.

BACKGROUND

Particular embodiments generally relate to digitally controlled oscillators (DCOs).

Unless otherwise indicated herein, the approaches described in this section are not prior art to the claims in this application and are not admitted to be prior art by inclusion in this section.

A digitally controlled oscillator (DCO) is used in systems including an all-digital phase lock loop (DLL), frequency lock loop (FLL), or in DLLs that perform clock synthesis and data recovery. In one example, the DCO is used in the all-digital DLL to generate a radio frequency (RF) signal with a frequency proportional to a reference clock.

FIG. 1 shows an example of a conventional PLL 100. A DCO 102 generates the RF signal ($f_{osc}$) with a frequency proportional to a reference clock ($f_{ref}$). The output of DCO 102 is divided by a frequency divider 104. The output of frequency divider 104 is input into a time digital converter (TDC) 106. TDC 106 receives the reference clock and the divided frequency signal and determines an error between the reference clock and the divided frequency signal. The error is output to a low pass loop filter 108, which produces a digital word that is input into DCO 102. DCO 102 uses the digital word to generate the RF signal.

FIG. 2 shows an example of a conventional DCO 200. An inductor-capacitor (LC) tank 202 includes an inductor 204 ($L_{tank}$) and capacitor ($C_{tank}$) 206. A tuning capacitor 208, a pair of cross-coupled transistors (M1 and M2) 214, and a bias current source (Ib) 210 are also provided. Tuning capacitor 208 is tuned to adjust the frequency that is output from LC tank 202. A resistance loss (resistor $R_{loss}$ 209) models the losses of inductor 204 and capacitor 206. Cross-coupled pair of transistors M1 and M2 introduce a negative resistance (−R) that compensates for the losses of LC tank 202 and keeps an output signal of DCO 200 oscillating.

FIG. 3 shows a model of DCO 200. The negative resistance −R is shown in parallel with inductor 204, capacitor 206, tuning capacitor 208, and the resistor 209. The capacitance of tuning capacitor 208 is adjusted using a capacitor bank present in LC tank 202. For example, the following equations are used to adjust the frequency:

$$f_{osc} = \frac{1}{2\pi\sqrt{C_{tank}L_{tank}}} \Delta f_{osc} = -f_{osc} \cdot \frac{\Delta C_{tank}}{2},$$

where $f_{osc}$ is the output signal of DCO 200 (or LC tank 202), $\Delta f_{osc}$ is the frequency variation of the output signal, and $\Delta C_{tank}$ is the variance of the tuning capacitance of tuning capacitor 208. For example, if a 2 kHz frequency resolution at 3.3 GHz is desired where the capacitance value of capacitor 206 is $C_{tank}$=4.5 pF and the inductance value of inductor 204 is L=500 pH, then tuning capacitor 208 has a tuning capacitance of $\Delta C_{tank}$=5 actoFarads (aF). $\Delta C_{tank}$ may be the value of each capacitor in the capacitor bank. In this case, the tuning capacitance is a capacitance that is smaller than technology can implement effectively.

One solution for solving the problem of having a tuning capacitance that is too small to implement is to use dithering. FIG. 4a shows an example of a DCO model 400 using a dithering implementation. An equivalent capacitance $\Delta C_{eq}$ seen by LC tank 202 is less than a capacitance ($\Delta C$) 402 because of the dithering being applied using a digital switch 410. Referring to FIG. 4b, switching at a high frequency between two capacitances, $C_{tank}$ and $\Delta C$, provides an equivalent capacitance $\Delta C_{eq}$.

FIG. 4b shows a signal 404 output by a digital $\Sigma\Delta$ 408 of FIG. 4a. When signal 404 is low, the capacitance is $C_{tank}$. When signal 404 is high, the capacitance is $\Delta C + C_{tank}$. A time 406 when the capacitance is $\Delta C + C_{tank}$ is a time $T_d$ and a time for a period of signal 404 is $T_r$. $T_d/T_r$ is the time in which a capacitance $\Delta C$ is added to the capacitance $C_{tank}$. This yields an equivalent capacitance shown by the equation:

$$C_{eq} = C_{tank} + \Delta C \frac{T_d}{T_r}.$$

In the implementation of FIG. 4a, a signal $f_{dth}$ is input into digital $\Sigma\Delta$ 408. Digital $\Sigma\Delta$ 408 takes an 8 bit signal and outputs a 3-bit signal 404 that is used to open and close a switch 410. Dithering of the 3 less significant bits of the 8 bit signal is provided. The value for $\Delta C$ is larger than a capacitance of around an aF, but dithering lowers the equivalent capacitance $\Delta C_{eq}$ that is seen from the physical capacitances implemented by capacitor 402.

Dithering may lower the equivalent capacitance and allow larger capacitances to be used, but noise is increased from the 3 bit signal. The quantization noise is moved to higher frequencies where generally the noise-phase specifications are more challenging. Due to this problem, the frequency of dithering may be significantly increased.

SUMMARY

In one embodiment, an apparatus includes a first circuit of a digitally controlled oscillator (DCO). The first circuit has a loss component. A second circuit is coupled to the first circuit and configured to transform a positive impedance into a negative impedance in series with a negative resistance. The negative impedance includes an adjustable reactive component used to adjust a frequency of an output signal of the DCO. An equivalent reactance seen by the first circuit is less than a reactance of the adjustable reactive component.

In one embodiment, wherein the reactive component comprises a matrix of varactors. A first set of varactors are coupled to a first reference voltage; a second set of varactors are coupled to a second reference voltage; and a variable varactor is coupled to a variable voltage signal.

In one embodiment, the second circuit comprises a cross coupled pair of transistors in series with the reactive component.

In one embodiment, a method includes receiving an error estimate of an output signal of a DCO. The error estimate is determined by comparing the output signal to a reference signal. The method further includes adjusting a reactance of a reactive component to adjust a frequency of the output signal based on the error estimate. An equivalent reactance seen by a tank circuit of the DCO is less than the reactance of the reactive component.

In one embodiment, the method coupling a first set of varactors to a first reference voltage; coupling a second set of varactors to a second reference voltage; and coupling a variable varactor to variable voltage signal.

In one embodiment, a system includes the apparatus. The DCO receives an input signal of an error estimation of an output signal of the DCO and a reference signal and adjusts the capacitance value of the capacitor based on the input signal.

The following detailed description and accompanying drawings provide a more detailed understanding of the nature and advantages of the present invention.

BRIEF DESCRIPTION OF DRAWINGS

FIG. 4b shows a signal output by a digital ΣΔ of FIG. 4a.

DESCRIPTION

Described herein are techniques for a DCO. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
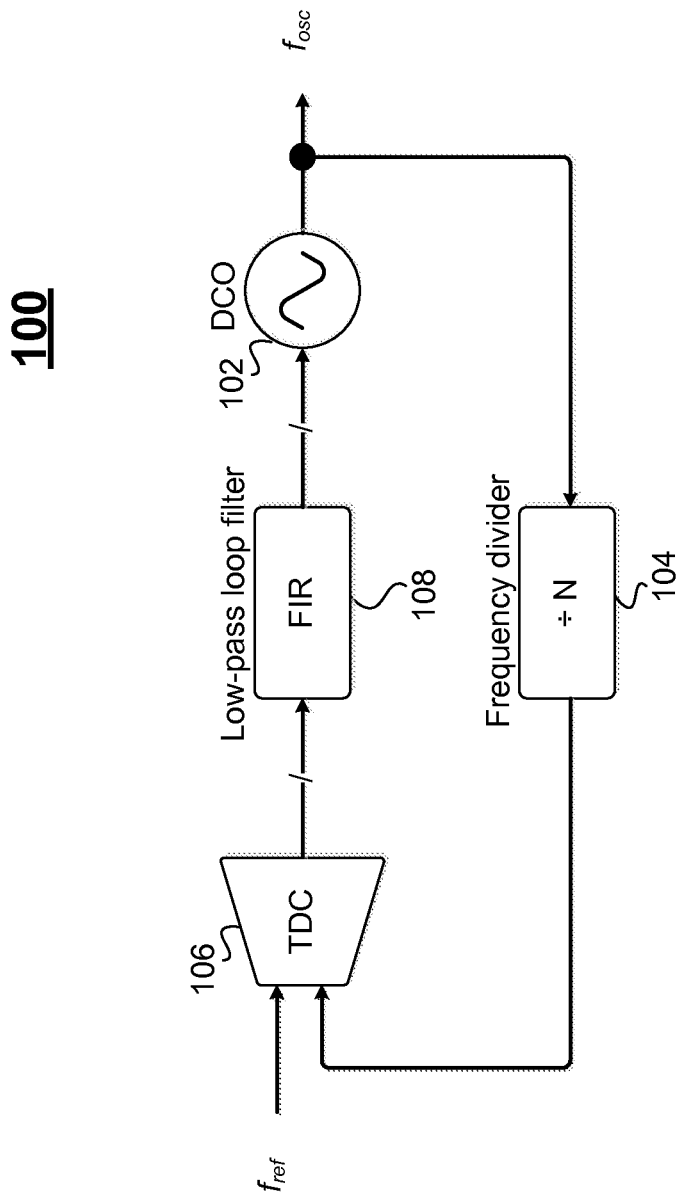
FIG. 1 shows an example of a conventional PLL.
Figure 3:
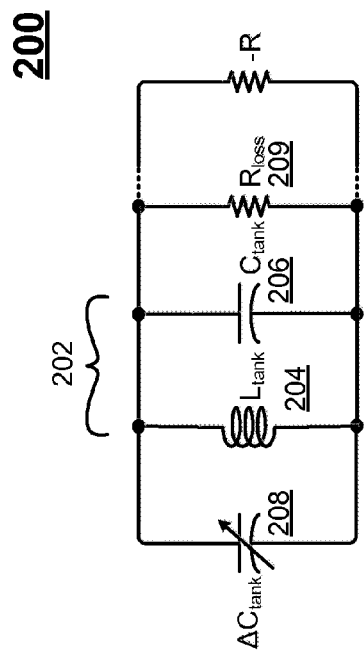
FIG. 3 shows a model of the DCO.
Figure 2:
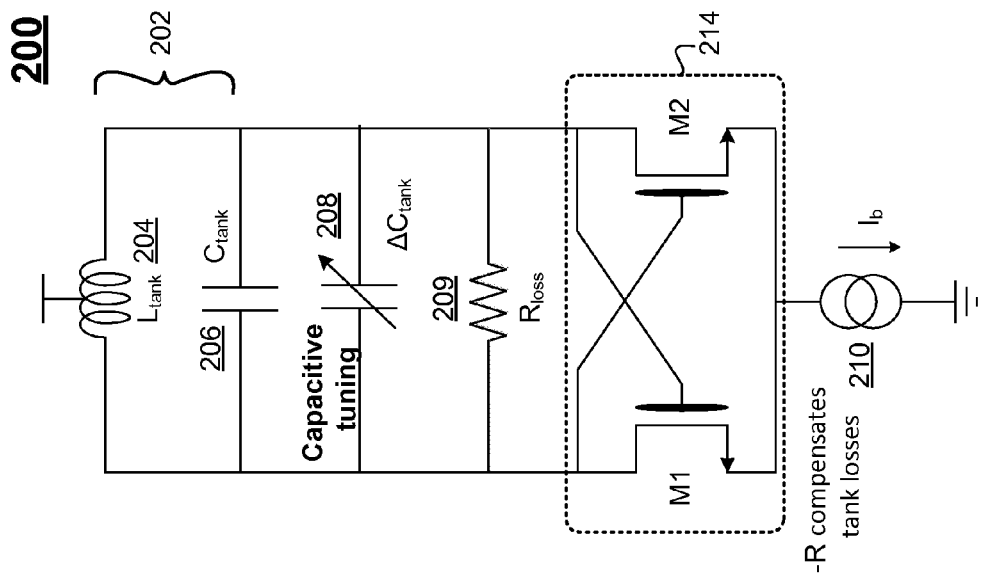
FIG. 2 shows an example of a conventional DCO.
Figure 4A:
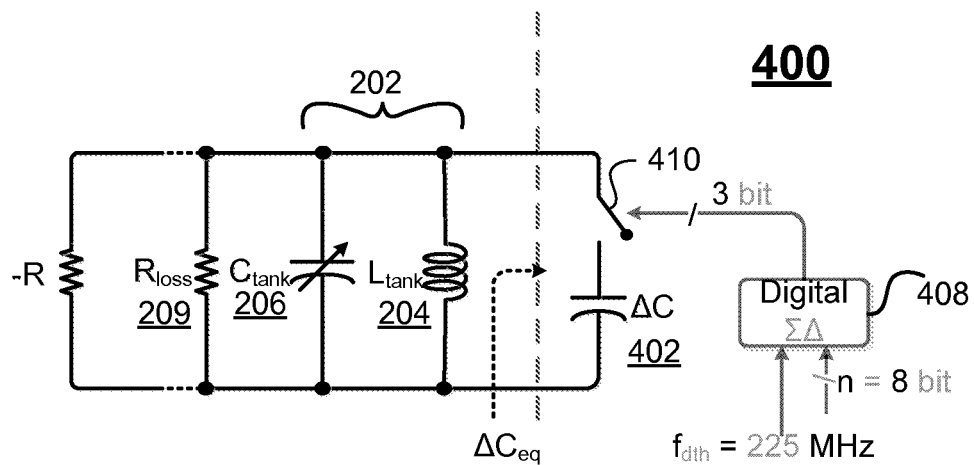
FIG. 4a shows an example of a DCO model using a dithering implementation.
Figure 4B:
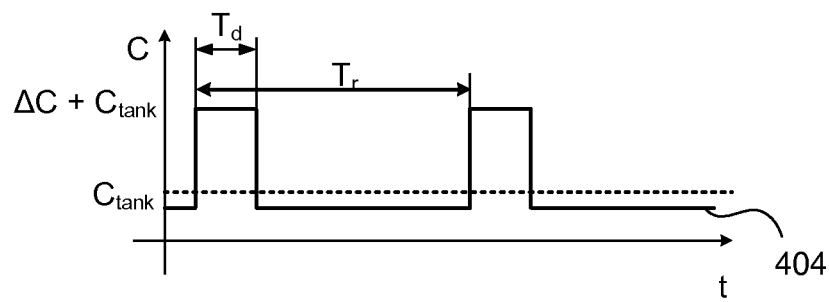
Figure 5:
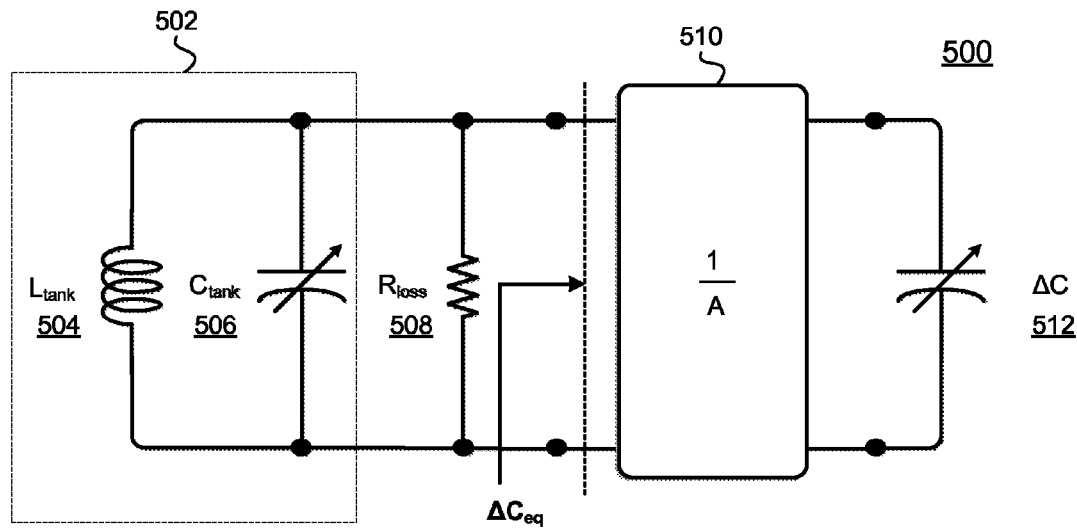
FIG. 5 shows an example of a DCO model according to one embodiment.

FIG. 5 shows an example of a DCO model 500 according to one embodiment. An LC tank 502 includes an inductor ($L_{tank}$) 504 and capacitor ($C_{tank}$) 506. LC tank 502 may be a resonant tank that may be an LC tank, a capacitor in parallel with an equivalent inductance or an inductor in parallel with an equivalent capacitance. A resistance representing the loss of LC tank 502 is shown as a resistor ($R_{loss}$) 508.

An impedance transformer 510 allows a capacitive variation ($\Delta C_{eq}$) seen by LC tank 202 to be lower than a capacitive variance of a capacitor ($\Delta C$) 512. An equivalent capacitance $\Delta C_{eq}$ may be:

$$\Delta C_{eq} = \frac{\Delta C}{A}$$

where A is a shrinking factor. The shrinking factor may be an amount of capacitive reduction that is seen by LC tank 502. $\Delta C_{eq}$ may be the resolution in capacitive tuning that can be used.

Figure 6:
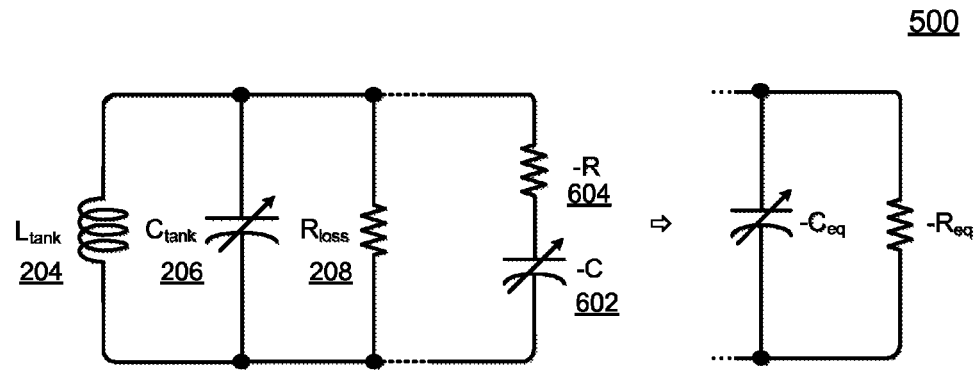
FIG. 6 shows another example of DCO model according to one embodiment.

FIG. 6 shows another example of DCO model 500 according to one embodiment. A negative capacitance shown as a capacitor (-C) 602 is in series with the negative resistance shown as a resistor (-R) 604. The capacitance -C appears shrunk in parallel to LC tank 502. Thus, a smaller capacitance can be used to enable fine frequency tuning than the actual capacitance used. The equivalent capacitance may be:

$$C_{eq} = \frac{C}{(\omega_0 RC)^2} = CQ_f^2, Q_f^2 \ll 1.$$

The term $(\omega_0 RC)^2$ is $1/Q_f^2$. The transistors will be described below in an implementation of a DCO. R is the resistance of resistor 604 and C is the capacitance of capacitor 602. $Q_f$ is a shrinking factor of the negative capacitance in series with the negative resistance. In one example, the capacitance -C is reduced by a factor proportional to the square of a transistor transductance, which will be described below. The negative resistance (-R) used to compensate the losses of LC tank 202 does not change significantly in that:

$$-R_{eq} \approx -R.$$

Accordingly, the equivalent capacitance $-C_{eq}$ depends on the value of the transductance gm. As will be described below, the value of the negative resistance -R depends on a cross-coupled pair of transistors that are coupled to LC tank 202. The impedance transformation depends on the transductance of the cross coupled pair of transistors.

Figure 7:
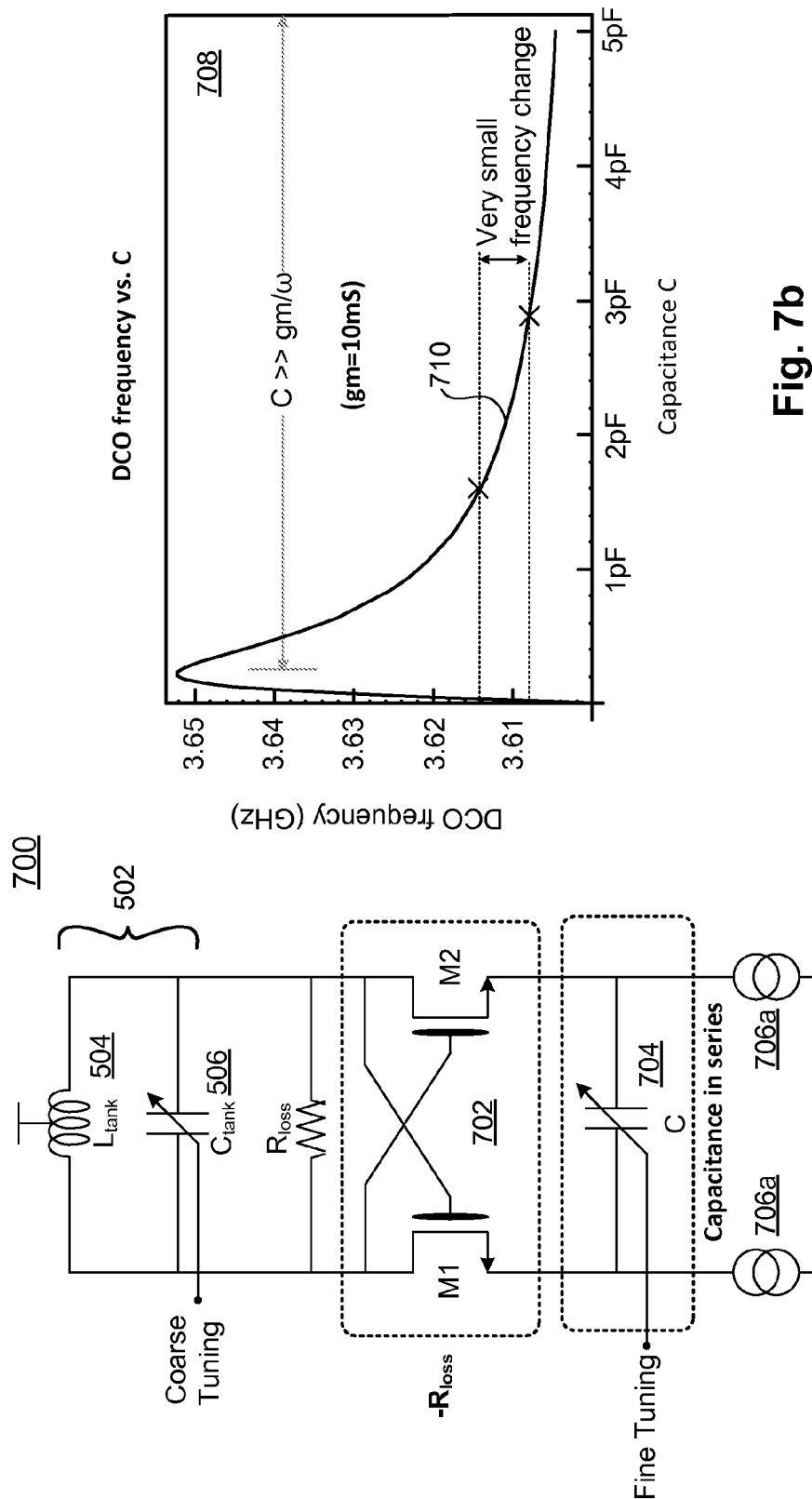
FIG. 7a shows an example of a DCO according to one embodiment.
FIG. 7b shows a graph of the DCO frequency vs. the capacitance C of a tuning capacitor according to one embodiment.

FIG. 7a shows an example of a DCO 700 according to one embodiment. DCO 700 includes an LC tank 502, which includes inductor 504 and capacitor 506. Capacitor 506 may provide coarse tuning to account for process and temperature variations. A circuit for transforming a positive impedance into a negative impedance is provided. For example, the circuit includes a cross-coupled pair of transistors (M1 and M2) 702 and a tuning capacitor (C) 704. Cross-coupled pair of transistors 702 synthesize a negative resistance. Transistors M1 and M2 have their gates cross-coupled to the drains of each other. Also, the drains of transistors M1 and M2 are respectively coupled to LC tank 502. The sources of transistors M1 and M2 are coupled to a reactive component shown as tuning capacitor (C) 704. Tuning capacitor 704 provides the negative capacitance that is shown in series with the negative resistance in FIG. 6. The reactive component may also be inductive, but a capacitive component will be used for discussion purposes. Additionally, current sources 706a are provided to bias transistors M1 and M2.

Tuning capacitor 704 allows fine tuning of the frequency of an output signal output by LC tank 502 (or DCO 700). FIG. 7b shows a graph 708 of the DCO frequency vs. the capacitance C of tuning capacitor 704 according to one embodiment. The Y axis shows the DCO frequency of the output signal in gigahertz (GHz) and the X axis shows the capacitance C. As shown around the value of capacitance value C between 2 pF and 3 pF, a curve 710 is relatively flat. Thus, a large amount of capacitance change results in a small frequency change, which provides a small frequency resolution. That is, a large amount of capacitance can be changed to achieve a smaller frequency change in the output signal of DCO 700. This allows for the use of larger values of capacitors (ΔC) in a capacitor bank of tuning capacitor 704.

For the capacitance value C>>gm/ω, then the following output signal is provided For C>>gm/ω:

$$f_{osc} = \frac{1}{\sqrt{C_{tank} L_{tank}}} \cdot \sqrt{1 + \frac{g_m^2 L}{8C}},$$

where gm is the transductance of transistors M1 and M2, L is the inductance of LC tank 502, and $f_{osc}$ is the output signal of LC tank 502. The capacitance C at the sources of transistors M1 and M2 is reflected in parallel to LC tank 502 and is reduced by a factor proportional to the square of the transductance of transistors M1 and M2. The capacitance C of tuning capacitor 704 at the sources of transistors M1 and M2 produces the same effect as a capacitor of a reduced capacitance in parallel to LC tank 502. The placing of the tuning capacitor 704 at the sources of transistors M1 and M2 also does not affect the intrinsic phase noise of DCO 700.

Figure 8:
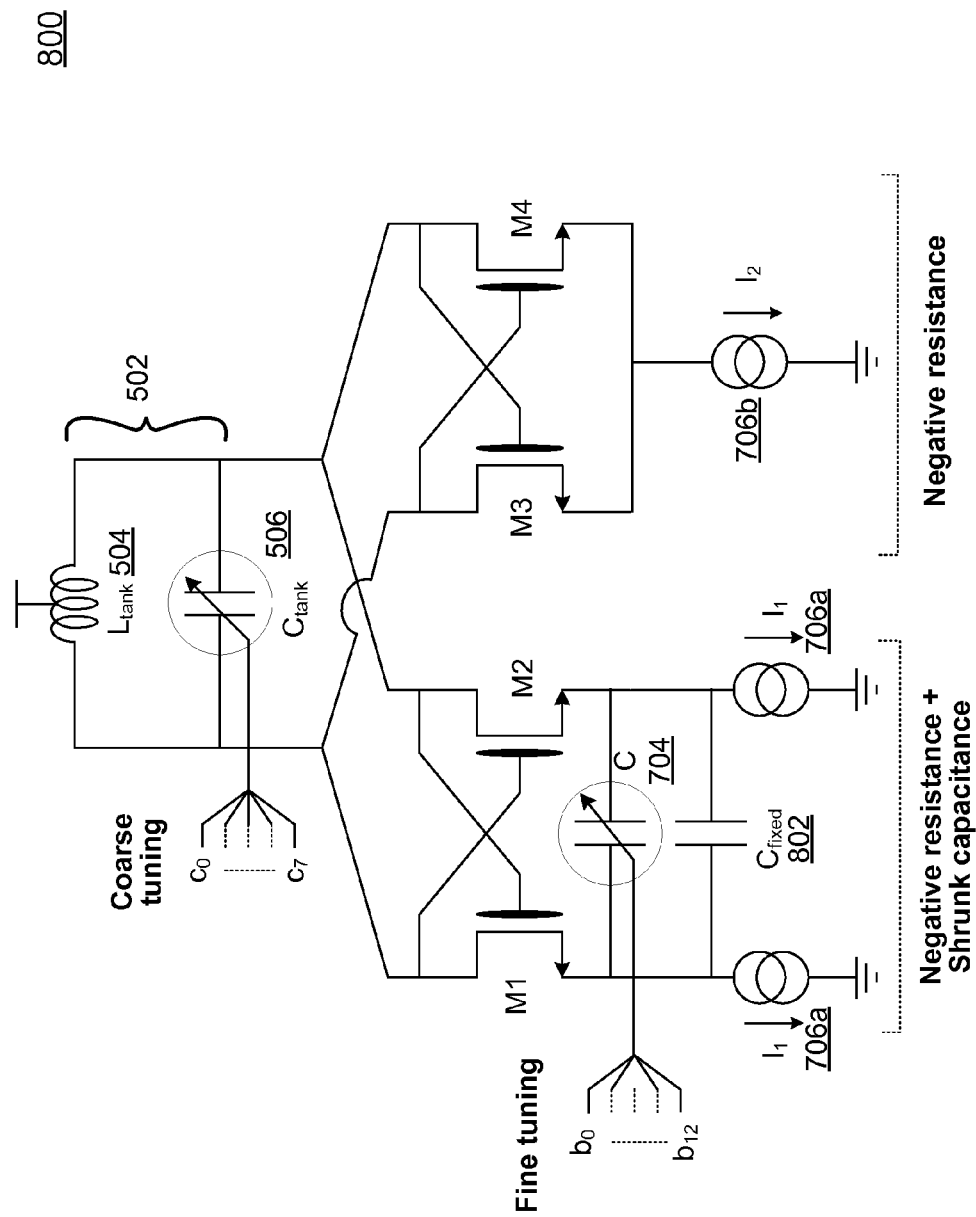
FIG. 8 shows another example of a DCO according to one embodiment.

The value of the transductance gm required to sustain the oscillation of DCO 700 (and to synthesize the negative resistance) may make the value of the capacitance C large. Transistors M1 and M2 may be separated from the cross-coupled pair of transistors that synthesize the negative resistance to allow for the capacitance C to be selected independently. FIG. 8 shows another example of a DCO 800 according to one embodiment. In DCO 800, an additional pair of cross-coupled transistors M3 and M4 is added and coupled to LC tank 502. In this case, transistors M3 and M4 provide the negative resistance (–R). Transistors M1 and M2 are then used to provide the negative capacitance. A designer is free of the restrictions of the value of transductance gm that is required to sustain the oscillation because transistors M1 and M2 are separate from transistors M3 and M4. Transistors M3 and M4 are then designed to sustain the oscillation and add a degree of freedom in choosing the shrinking factor.

In this implementation, tuning capacitor 704 is used along with a fixed capacitor ($C_{fixed}$) 802. The value of the capacitance $C_{fixed}$ is adjusted by the capacitance C.

Current sources ($I_1$) 706a are used to bias transistors M1 and M2. A current source ($I_2$) 706b is used to bias transistors M3 and M4. By programming currents $I_1$ and $I_2$, the fine tuning range and resolution of capacitance can be tuned without changing the signal amplitude of the output signal for DCO 800.

The coarse tuning of capacitor $C_{tank}$ 506 is used to compensate for processing temperature variations and to select a channel for the output signal DCO 800. Coarse tuning may use 8 bits denoted as c0-c7.

Figure 9:
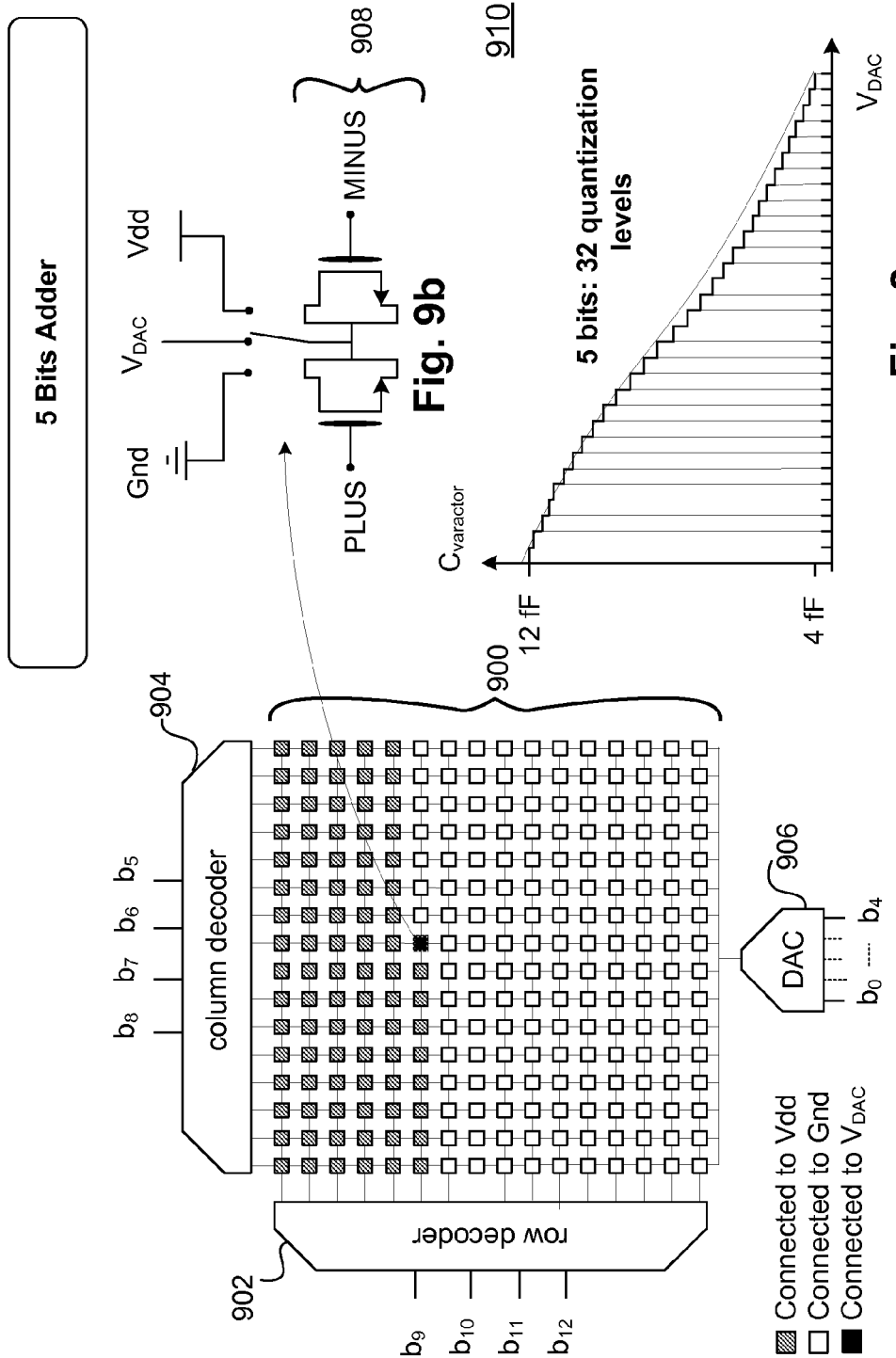
FIG. 9a shows an example of the tuning of capacitor according to one embodiment.
FIG. 9b shows an example of a varactor coupled to the voltage $V_{DAC}$ according to one embodiment.
FIG. 9c shows an example of capacitance values that are provided based on the value of the voltage $V_{DAC}$.

The fine tuning may have a 13-bit resolution represented by b0-b12. The bits are used to configure a capacitor bank. FIG. 9a shows an example of the tuning of capacitor 704 according to one embodiment. Although this implementation is shown, other implementations may be provided.

A matrix of capacitors are used for tuning the capacitance. In one embodiment, a matrix 900 of varactors are used. A varactor may be a type of diode that has a variable capacitance that is a function of the voltage impressed on its terminals. Matrix 900 of varactors are coupled to a row decoder 902, a column decoder 904, and a digital-to-analog (DAC) converter 906.

Row decoder 902 receives bits b9-b12, column decoder 904 receives bits b5-b8, and DAC 906 receives bits b0-b4. Depending on bits b0-b12, different values of capacitance may be provided. For example, a varactor may be coupled to a supply voltage (Vdd), ground (Gnd), or a voltage $V_{DAC}$. The varactors are toggled in and out to determine a total capacitance. For example, varactors coupled to the supply voltage are turned on and varactors coupled to ground are turned off. Also, the varactor coupled to the voltage $V_{DAC}$ is also turned on. The varactors coupled to the supply voltage provide a fixed amount of capacitance and the varactor coupled to the voltage $V_{DAC}$ has a variable capacitance.

FIG. 9b shows an example of a varactor 908 coupled to the voltage $V_{DAC}$ according to one embodiment. As shown, the varactor may be coupled to ground, supply voltage $V_{DD}$, or voltage $V_{DAC}$. When varactor 908 is coupled to voltage $V_{DAC}$, different values of capacitance are provided depending on the value of the voltage $V_{DAC}$. For example, FIG. 9c shows an example of capacitance values that are provided based on the value of the voltage $V_{DAC}$. In a graph 910, the Y axis is the capacitance value of varactor 908. Also, the X axis shows the value of the voltage $V_{DAC}$.

For 5 bits, 32 quantization levels are provided. As shown, the values of the capacitance ($C_{varactor}$) may vary from 4 fF to 12 fF. Using this varying capacitance, fewer varactors may be needed to achieve a 13-bit resolution of capacitance for tuning capacitor 704. For example, if a 13-bit resolution is needed, $13^{13}$ varactors are needed to achieve this resolution. However, using a matrix of 256 varactors, the 13-bit resolution can be achieved using a variable capacitance provided by varactor 908. Less area on a chip is used and routing is also simplified.

The coarse tuning of capacitor 506 may also use a structure similar to matrix 900. However, the matrix may be smaller to due to the 8-bit resolution. The 3 least significant bits of the matrix used in the coarse-tuning array may be substituted with a varactor able to be tuned to different capacitances using a voltage $V_{DAC}$ as described in FIG. 9a.

Figure 10:
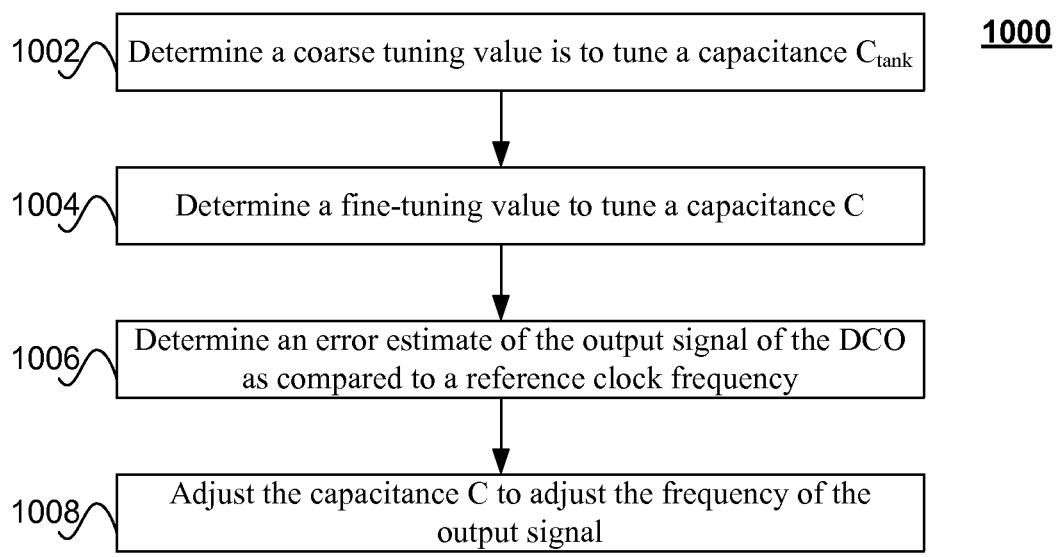
FIG. 10 shows a simplified flowchart of a method for providing an oscillating signal using a DCO according to one embodiment.

FIG. 10 shows a simplified flowchart 1000 of a method for providing an output signal using DCO 700 according to one embodiment. At 1002, a coarse tuning value is determined to tune a capacitance $C_{tank}$ for capacitor 506. At 1004, a fine-tuning value is determined to tune a capacitance C for capacitor 704.

At 1006, an error estimate of the output signal of DCO 700 as compared to a reference clock frequency is determined. At 1008, the capacitance C of capacitor 704 is adjusted to adjust the frequency of the output signal of DCO 700 based on the error estimation.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A digitally controlled oscillator (DCO) configured to generate a radio frequency (RF) output signal, the DCO comprising:

an inductor-capacitor (LC) tank circuit having a loss component, the LC tank configured to generate an output frequency of the RF output signal;

an impedance transformer circuit configured to transform a positive impedance associated with the loss component into a negative impedance; and a tuning circuit configured to tune the output frequency of the RF output signal, wherein the impedance transformer circuit comprises a first transistor, a second transistor cross-coupled with the first transistor, a third transistor, and a fourth transistor cross-coupled with the third transistor, wherein the third transistor and the fourth transistor are connected in parallel with the first transistor and the second transistor, wherein a gate of the first transistor is connected to a drain of the second transistor, a gate of the second transistor is connected to a drain of the first transistor, the drain of the first transistor and the drain of the second transistor are connected to the LC tank circuit, and a source of the first transistor and a source of the second transistor are connected to the tuning circuit, and wherein the source of the first transistor is connected, via the tuning circuit, to a first current source configured to bias the first transistor, and wherein the source of the second transistor is connected, via the tuning circuit, to a second current source configured to bias the second transistor.

2. The DCO of claim 1, wherein the impedance transformer circuit is connected between the LC tank circuit and the tuning circuit.

3. The DCO of claim 1, wherein the LC tank circuit includes an inductor and a capacitor having an adjustable capacitance.

4. The DCO of claim 1, wherein the impedance transformer circuit provides a negative resistance.

5. The DCO of claim 1, wherein the tuning circuit includes at least one of a reactive component and an inductive component.

6. The DCO of claim 5, wherein the tuning circuit includes a capacitor having an adjustable capacitance, and wherein adjusting the adjustable capacitance adjusts the output frequency of the RF output signal.

7. A method of operating a digitally controlled oscillator (DCO) configured to generate a radio frequency (RF) output signal, the method comprising:

using an inductor-capacitor (LC) tank circuit having a loss component, generating an output frequency of the RF output signal;

transforming a positive impedance associated with the loss component into a negative impedance;

using a tuning circuit, tuning the output frequency of the of the RF output signal, wherein the transforming the positive impedance into the negative impedance includes using an impedance transformer circuit that comprises a first transistor, a second transistor cross-coupled with the first transistor, a third transistor, and a fourth transistor cross-coupled with the third transistor, wherein the third transistor and the fourth transistor are connected in parallel with the first transistor and the second transistor, and wherein a gate of the first transistor is connected to a drain of the second transistor, a gate of the second transistor is connected to a drain of the first transistor, and the drain of the first transistor and the drain of the second transistor are connected to the LC tank circuit;

biasing, via the tuning circuit, a source of the first transistor using a first current source; and biasing, via the tuning circuit, a source of the second transistor using a second current source.

8. The method of claim 7, wherein the transforming includes transforming the positive impedance into the negative impedance using an impedance transformer circuit connected to the LC tank circuit.

9. The method of claim 7, wherein the LC tank circuit includes an inductor and a capacitor having an adjustable capacitance.

10. The method of claim 7, wherein the transforming includes providing a negative resistance.

11. The method of claim 7, wherein the tuning includes using at least one of a reactive component and an inductive component.

12. The method of claim 7, wherein the tuning includes using a capacitor having an adjustable capacitance, and wherein adjusting the adjustable capacitance adjusts the output frequency of the RF output signal.

* * * * *